US011900009B2

(12) United States Patent
Lei et al.

(10) Patent No.: US 11,900,009 B2
(45) Date of Patent: Feb. 13, 2024

(54) SYSTEM AND METHOD FOR ADAPTIVE AUTOMATED PRESET AUDIO EQUALIZER SETTINGS (71) Applicant: DELL PRODUCTS, LP, Round Rock, TX (US)

(72) Inventors: Guo Lei, Sengkang (SG); Kok Chin Teow, Bukit Batok (SG)

(73) Assignee: Dell Products L.P., Round Rock, TX (US)

( * ) Notice: Subject to any disclaimer, the term of this patent is extended or adjusted under 35 U.S.C. 154(b) by 228 days.

(21) Appl. No.: 17/125,177

(22) Filed: Dec. 17, 2020

(65) Prior Publication Data

US 2022/0197588 A1 Jun. 23, 2022

(51) Int. Cl.
G06F 3/16 (2006.01)
G06V 10/50 (2022.01)
H04N 21/434 (2011.01)
H04N 5/04 (2006.01)
H03G 3/32 (2006.01)
H04R 27/00 (2006.01)
H04R 29/00 (2006.01)
H04R 1/10 (2006.01)
H04N 21/84 (2011.01)
H04N 5/60 (2006.01)

(52) U.S. Cl.
CPC ............ *G06F 3/165* (2013.01); *G06V 10/507* (2022.01); *G06V 2201/02* (2022.01); *G06V 2201/10* (2022.01); *H03G 3/32* (2013.01); *H04N 5/04* (2013.01); *H04N 5/607* (2013.01); *H04N 21/4345* (2013.01); *H04N 21/84* (2013.01); *H04R 1/1083* (2013.01); *H04R 27/00* (2013.01); *H04R 29/001* (2013.01)

(58) Field of Classification Search
CPC ........ H03G 3/32; H03G 3/3005; G06F 3/165; G06V 10/507; G06V 2201/02; G06V 2201/10; H04R 3/00; H04R 29/001; H04R 27/00; H04R 1/1083; H04R 2227/001; H04N 21/4345; H04N 21/4341; H04N 21/4135; H04N 5/44; H04N 5/607; H04N 5/602
See application file for complete search history.

(56) References Cited

U.S. PATENT DOCUMENTS 8,049,741 B2   11/2011  Knepper et al.
10,148,241 B1  12/2018  Peeler et al.
10,705,781 B1   7/2020  Guo et al.
2007/0192782 A1*  8/2007  Ramaswamy ....... H04N 21/426
                                                 725/15

(Continued)

FOREIGN PATENT DOCUMENTS

NL        1030365 C2 *  9/2007  ............. G09G 5/005
WO  WO-2015144243 A1 * 10/2015  ......... H04N 21/4345

Primary Examiner — Carolyn R Edwards
Assistant Examiner — Kuassi A Ganmavo
(74) Attorney, Agent, or Firm — Larson Newman, LLP (57) ABSTRACT An information handling system determines a frame rate of a frame or an image, and determines a type of an application based on a histogram analysis of the frame or the image analysis and on the frame rate. A hardware equalizer setting may also be applied for audio content based on the application type, wherein the hardware equalizer setting is from a pre-defined list of applications with corresponding hardware equalizer settings.

20 Claims, 7 Drawing Sheets

(56) References Cited

U.S. PATENT DOCUMENTS

| | | | |
|---|---|---|---|
| 2008/0175411 A1* | 7/2008 | Greve | G10H 1/0041 381/103 |
| 2009/0064267 A1* | 3/2009 | Lee | H04N 21/435 725/151 |
| 2009/0281643 A1* | 11/2009 | Higuchi | H04N 21/4345 348/554 |
| 2010/0071005 A1* | 3/2010 | Kusunoki | H04N 21/4667 725/46 |
| 2011/0196520 A1* | 8/2011 | Peterson | G06F 3/165 700/94 |
| 2012/0287119 A1* | 11/2012 | Tsai | G09G 3/342 345/419 |
| 2014/0071105 A1* | 3/2014 | Nakanishi | G09G 3/3614 345/96 |
| 2016/0335967 A1* | 11/2016 | Qu | G09G 3/20 |
| 2017/0264970 A1* | 9/2017 | Mitra | H04N 21/44008 |
| 2018/0084303 A1* | 3/2018 | Chen | H04N 21/435 |
| 2018/0124514 A1 | 5/2018 | Peeler et al. | |

* cited by examiner

SYSTEM AND METHOD FOR ADAPTIVE AUTOMATED PRESET AUDIO EQUALIZER SETTINGS

FIELD OF THE DISCLOSURE

The present disclosure generally relates to information handling systems, and more particularly relates to adaptive automated preset audio equalizer settings.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An information handling system determines a frame rate of a frame or an image, and determines a type of an application based on a histogram analysis of the frame or the image analysis and on the frame rate. A hardware equalizer setting may also be applied for audio content based on the application type, wherein the hardware equalizer setting is from a pre-defined list of applications with corresponding hardware equalizer settings.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Figure 1:
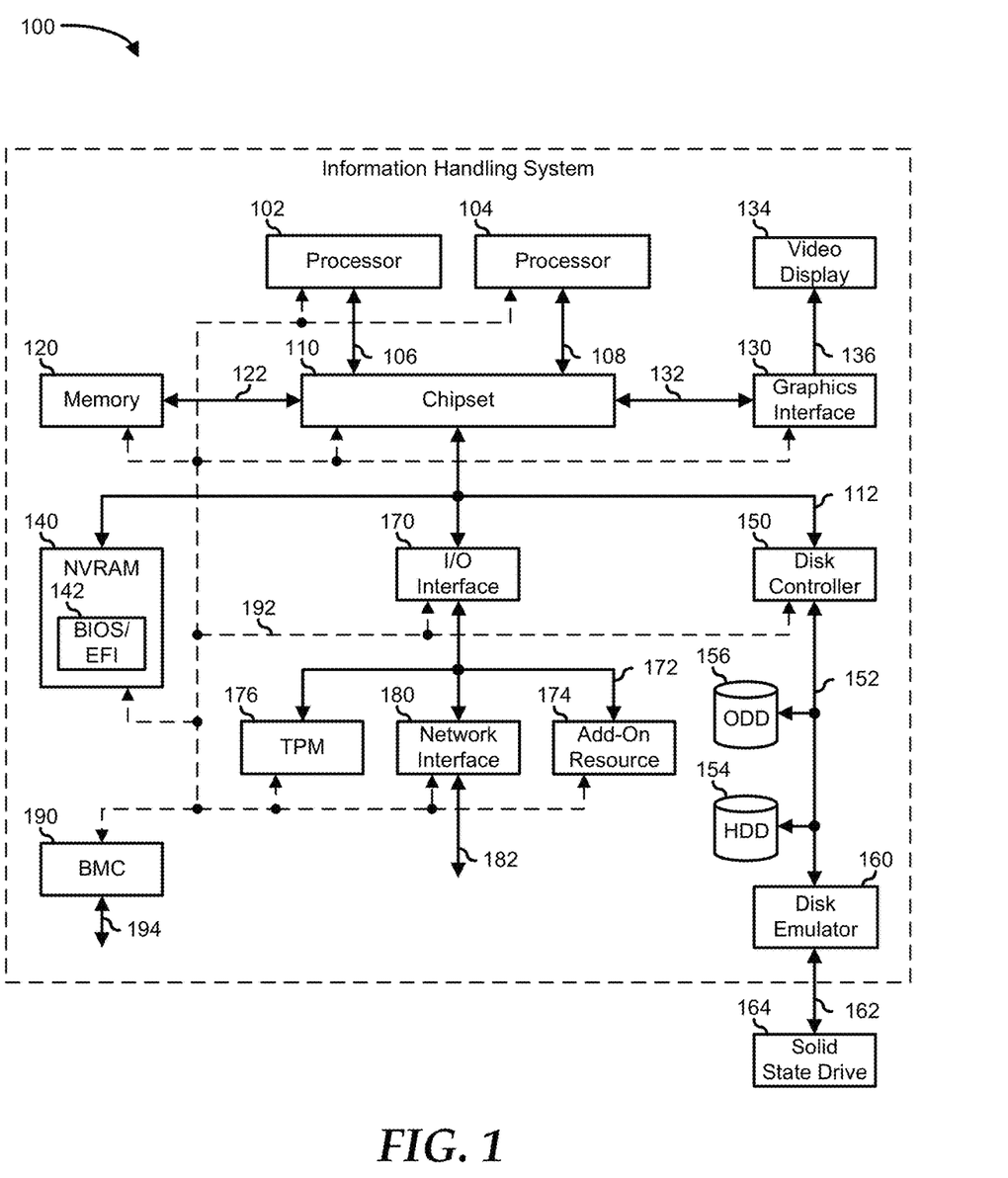
FIG. 1 is a block diagram illustrating an information handling system according to an embodiment of the present disclosure.

FIG. 1 illustrates an embodiment of an information handling system 100 including processors 102 and 104, a chipset 110, a memory 120, a graphics adapter 130 connected to a video display 134, a non-volatile RAM (NV-RAM) 140 that includes a basic input and output system/extensible firmware interface (BIOS/EFI) module 142, a disk controller 150, a hard disk drive (HDD) 154, an optical disk drive 156, a disk emulator 160 connected to a solid-state drive (SSD) 164, an input/output (I/O) interface 170 connected to an add-on resource 174 and a trusted platform module (TPM) 176, a network interface 180, and a baseboard management controller (BMC) 190. Processor 102 is connected to chipset 110 via processor interface 106, and processor 104 is connected to the chipset via processor interface 108. In a particular embodiment, processors 102 and 104 are connected together via a high-capacity coherent fabric, such as a HyperTransport link, a QuickPath Interconnect, or the like. Chipset 110 represents an integrated circuit or group of integrated circuits that manage the data flow between processors 102 and 104 and the other elements of information handling system 100. In a particular embodiment, chipset 110 represents a pair of integrated circuits, such as a northbridge component and a southbridge component. In another embodiment, some or all of the functions and features of chipset 110 are integrated with one or more of processors 102 and 104.

Memory 120 is connected to chipset 110 via a memory interface 122. An example of memory interface 122 includes a Double Data Rate (DDR) memory channel and memory 120 represents one or more DDR Dual In-Line Memory Modules (DIMMs). In a particular embodiment, memory interface 122 represents two or more DDR channels. In another embodiment, one or more of processors 102 and 104 include a memory interface that provides a dedicated memory for the processors. A DDR channel and the connected DDR DIMMs can be in accordance with a particular DDR standard, such as a DDR3 standard, a DDR4 standard, a DDR5 standard, or the like.

Memory 120 may further represent various combinations of memory types, such as Dynamic Random Access Memory (DRAM) DIMMs, Static Random Access Memory (SRAM) DIMMs, non-volatile DIMMs (NV-DIMMs), storage class memory devices, Read-Only Memory (ROM) devices, or the like. Graphics adapter 130 is connected to chipset 110 via a graphics interface 132 and provides a video display output 136 to a video display 134. An example of a graphics interface 132 includes a Peripheral Component Interconnect-Express (PCIe) interface and graphics adapter 130 can include a four-lane (×4) PCIe adapter, an eight-lane (×8) PCIe adapter, a 16-lane (×16) PCIe adapter, or another configuration, as needed or desired. In a particular embodiment, graphics adapter 130 is provided down on a system printed circuit board (PCB). Video display output 136 can include a Digital Video Interface (DVI), a High-Definition Multimedia Interface (HDMI), a DisplayPort interface, or the like, and video display 134 can include a monitor, a smart television, an embedded display such as a laptop computer display, or the like.

NV-RAM 140, disk controller 150, and I/O interface 170 are connected to chipset 110 via an I/O channel 112. An example of I/O channel 112 includes one or more point-to-point PCIe links between chipset 110 and each of NV-RAM 140, disk controller 150, and I/O interface 170. Chipset 110 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. NV-RAM 140 includes BIOS/EFI module 142 that stores machine-executable code (BIOS/EFI code) that operates to detect the resources of information handling system 100, to provide drivers for the resources, to initialize the resources, and to provide common access mechanisms for the resources. The functions and features of BIOS/EFI module 142 will be further described below.

Disk controller 150 includes a disk interface 152 that connects the disk controller to a hard disk drive (HDD) 154, to an optical disk drive (ODD) 156, and to disk emulator 160. An example of disk interface 152 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 160 permits SSD 164 to be connected to information handling system 100 via an external interface 162. An example of external interface 162 includes a USB interface, an institute of electrical and electronics engineers (IEEE) 1394 (Firewire) interface, a proprietary interface, or a combination thereof. Alternatively, SSD 164 can be disposed within information handling system 100.

I/O interface 170 includes a peripheral interface 172 that connects the I/O interface to add-on resource 174, to TPM 176, and to network interface 180. Peripheral interface 172 can be the same type of interface as I/O channel 112 or can be a different type of interface. As such, I/O interface 170 extends the capacity of I/O channel 112 when peripheral interface 172 and the I/O channel are of the same type, and the I/O interface translates information from a format suitable to the I/O channel to a format suitable to the peripheral interface 172 when they are of a different type. Add-on resource 174 can include a data storage system, an additional graphics interface, a network interface card (NIC), a sound/video processing card, another add-on resource, or a combination thereof. Add-on resource 174 can be on a main circuit board, on a separate circuit board or add-in card disposed within information handling system 100, a device that is external to the information handling system, or a combination thereof.

Network interface 180 represents a network communication device disposed within information handling system 100, on a main circuit board of the information handling system, integrated onto another component such as chipset 110, in another suitable location, or a combination thereof. Network interface 180 includes a network channel 182 that provides an interface to devices that are external to information handling system 100. In a particular embodiment, network channel 182 is of a different type than peripheral interface 172, and network interface 180 translates information from a format suitable to the peripheral channel to a format suitable to external devices.

In a particular embodiment, network interface 180 includes a NIC or host bus adapter (HBA), and an example of network channel 182 includes an InfiniBand channel, a Fibre Channel, a Gigabit Ethernet channel, a proprietary channel architecture, or a combination thereof. In another embodiment, network interface 180 includes a wireless communication interface, and network channel 182 includes a Wi-Fi channel, a near-field communication (NFC) channel, a Bluetooth or Bluetooth-Low-Energy (BLE) channel, a cellular based interface such as a Global System for Mobile (GSM) interface, a Code-Division Multiple Access (CDMA) interface, a Universal Mobile Telecommunications System (UMTS) interface, a Long-Term Evolution (LTE) interface, or another cellular based interface, or a combination thereof. Network channel 182 can be connected to an external network resource (not illustrated). The network resource can include another information handling system, a data storage system, another network, a grid management system, another suitable resource, or a combination thereof.

BMC 190 is connected to multiple elements of information handling system 100 via one or more management interface 192 to provide out of band monitoring, maintenance, and control of the elements of the information handling system. As such, BMC 190 represents a processing device different from processor 102 and processor 104, which provides various management functions for information handling system 100. For example, BMC 190 may be responsible for power management, cooling management, and the like. The term BMC is often used in the context of server systems, while in a consumer-level device a BMC may be referred to as an embedded controller (EC). A BMC included at a data storage system can be referred to as a storage enclosure processor. A BMC included at a chassis of a blade server can be referred to as a chassis management controller and embedded controllers included at the blades of the blade server can be referred to as blade management controllers. Capabilities and functions provided by BMC 190 can vary considerably based on the type of information handling system. BMC 190 can operate in accordance with an Intelligent Platform Management Interface (IPMI). Examples of BMC 190 include an Integrated Dell® Remote Access Controller (iDRAC).

Management interface 192 represents one or more out-of-band communication interfaces between BMC 190 and the elements of information handling system 100, and can include an Inter-Integrated Circuit (I2C) bus, a System Management Bus (SMBUS), a Power Management Bus (PMBUS), a Low Pin Count (LPC) interface, a serial bus such as a Universal Serial Bus (USB) or a Serial Peripheral Interface (SPI), a network interface such as an Ethernet interface, a high-speed serial data link such as a Peripheral Component Interconnect-Express (PCIe) interface, a Network Controller Sideband Interface (NC-SI), or the like. As used herein, out-of-band access refers to operations performed apart from a BIOS/operating system execution environment on information handling system 100, that is apart from the execution of code by processors 102 and 104 and procedures that are implemented on the information handling system in response to the executed code.

BMC 190 operates to monitor and maintain system firmware, such as code stored in BIOS/EFI module 142, option ROMs for graphics adapter 130, disk controller 150, add-on resource 174, network interface 180, or other elements of information handling system 100, as needed or desired. In particular, BMC 190 includes a network interface 194 that can be connected to a remote management system to receive firmware updates, as needed or desired. Here, BMC 190 receives the firmware updates, stores the updates to a data storage device associated with the BMC, transfers the firmware updates to NV-RAM of the device or system that is the subject of the firmware update, thereby replacing the currently operating firmware associated with the device or system, and reboots information handling system, whereupon the device or system utilizes the updated firmware image.

BMC 190 utilizes various protocols and application programming interfaces (APIs) to direct and control the processes for monitoring and maintaining the system firmware. An example of a protocol or API for monitoring and maintaining the system firmware includes a graphical user interface (GUI) associated with BMC 190, an interface defined by the Distributed Management Taskforce (DMTF) (such as a Web Services Management (WSMan) interface, a Management Component Transport Protocol (MCTP) or, a Redfish® interface), various vendor-defined interfaces (such as a Dell EMC Remote Access Controller Administrator (RACADM) utility, a Dell EMC OpenManage Enterprise, a Dell EMC OpenManage Server Administrator (OMSS) utility, a Dell EMC OpenManage Storage Services (OMSS) utility, or a Dell EMC OpenManage Deployment Toolkit (DTK) suite), a BIOS setup utility such as invoked by a "F2" boot option, or another protocol or API, as needed or desired.

In a particular embodiment, BMC 190 is included on a main circuit board (such as a baseboard, a motherboard, or any combination thereof) of information handling system 100 or is integrated onto another element of the information handling system such as chipset 110, or another suitable element, as needed or desired. As such, BMC 190 can be part of an integrated circuit or a chipset within information handling system 100. An example of BMC 190 includes an iDRAC or the like. BMC 190 may operate on a separate power plane from other resources in information handling system 100. Thus BMC 190 can communicate with the management system via network interface 194 while the resources of information handling system 100 are powered off. Here, information can be sent from the management system to BMC 190 and the information can be stored in a RAM or NV-RAM associated with the BMC. Information stored in the RAM may be lost after power-down of the power plane for BMC 190, while information stored in the NV-RAM may be saved through a power-down/power-up cycle of the power plane for the BMC.

Information handling system 100 can include additional components and additional busses, not shown for clarity. For example, information handling system 100 can include multiple processor cores, audio devices, and the like. While a particular arrangement of bus technologies and interconnections is illustrated for the purpose of example, one of skill will appreciate that the techniques disclosed herein are applicable to other system architectures. Information handling system 100 can include multiple central processing units (CPUs) and redundant bus controllers. One or more components can be integrated together. Information handling system 100 can include additional buses and bus protocols, for example, I2C and the like. Additional components of information handling system 100 can include one or more storage devices that can store machine-executable code, one or more communications ports for communicating with external devices, and various input and output (I/O) devices, such as a keyboard, a mouse, and a video display.

For purpose of this disclosure information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smartphone, a tablet device or other consumer electronic device, a network server, a network storage device, a switch, a router, or another network communication device, or any other suitable device and may vary in size, shape, performance, functionality, and price. Further, information handling system 100 can include processing resources for executing machine-executable code, such as processor 102, a programmable logic array (PLA), an embedded device such as a System-on-a-Chip (SoC), or other control logic hardware. Information handling system 100 can also include one or more computer-readable media for storing machine-executable code, such as software or data.

Currently, a typical user utilizes various software applications such as database applications, word processing applications, gaming applications, video playback for entertainment, video and voice communications, music player applications, and teleconference applications. Several of these applications have an audio and/or video output. Generally, monitors or display devices with built-in speakers provide one set of equalizer settings even though a built-in hardware equalizer can store and support multiple sets of hardware equalizer settings, also referred to herein as audio equalizer settings. In applications with audio output, a different user experience of audio performance is expected by a user. For example, a user playing a video game may want a different equalizer setting compared to when the aforementioned user is listening to music. However, the built-in speaker typically uses the same equalizer settings for each of the aforementioned applications.

Typical software equalizers support multiple equalizer settings. However, a user has to manually select the equalizer setting using an on-screen display for the application that the user is actively using every time she uses the application. For example, every time the user switches from playing a game to listening to a movie, she would have to change the equalizer setting. This can be annoying for the user if she has to switch to a different equalizer setting frequently. Also, the software equalizers generally provide a less accurate and less desirable user experience than a hardware equalizer which allows the ability to set each equalizer frequency band with a different bandwidth/frequency range. Hardware equalizers can set a more accurate frequency response compensation and set each equalizer frequency band with different bandwidth/frequency range in the form of band-pass, high pass, or low pass filter which provides a better user experience than a software equalizer which has a fixed frequency response with fixed bandwidth band-pass filter. To address the aforementioned issues, the present disclosure provides a system and method to provide a desirable user experience by allowing the ability to switch hardware equalizer settings also referred to herein as audio equalizer settings between applications adaptively. This adaptive audio equalizer setting is selected from preset hardware equalizer settings based on the application that is in operation.

Figure 2:
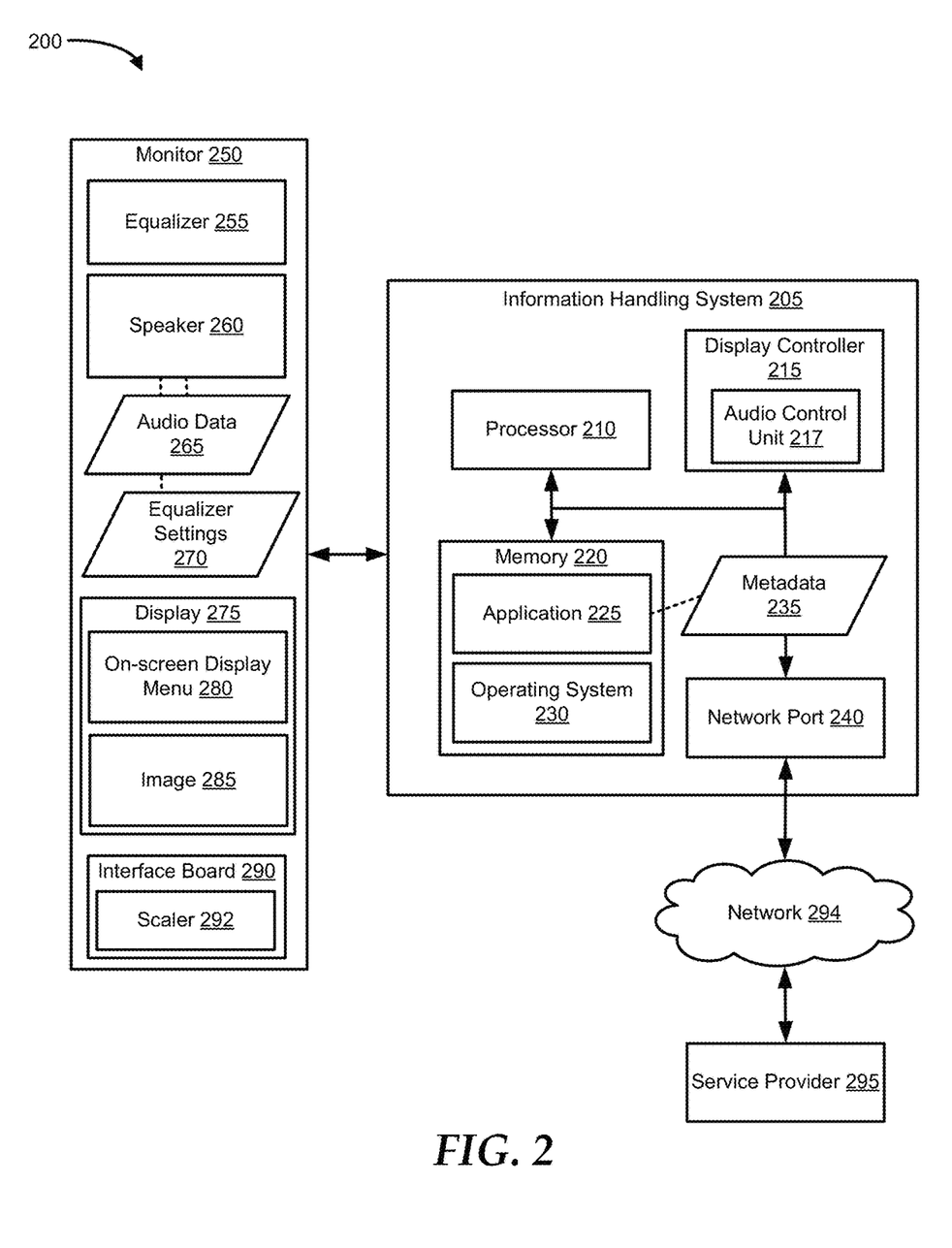
FIG. 2 is a block diagram illustrating an example of a system for adaptive automated preset audio equalizer settings, according to an embodiment of the present disclosure.

FIG. 2 shows a system 200 where systems and methods for switching audio equalizer settings adaptively can be implemented. The adaptive audio equalization may be implemented to allow the selection of a hardware equalizer setting based on an application in operation also referred to as an active operation. The hardware equalizer setting may be selected based on user application detection and/or analysis of the frame or image in the display. System 200 includes an information handling system 205, a monitor 250, a network 294, and a service provider 295. Information handling system 205 may be similar to information handling system 100 of FIG. 1. Information handling system 205 includes a display controller 215, a processor 210, a memory 220, and a network port 240. Display controller 215 includes an audio control unit 217. Memory 220 includes an application 225 and an operating system 230. Monitor 250 includes an equalizer 255, a speaker 260, a display 275, and an interface board 290. Display 275 includes an on-screen display menu 280, and an image 285. Interface board 290 includes a scaler 292.

Monitor 250 is an output device that displays information in pictorial form, also referred to as a display device. Monitor 250 includes a built-in speaker such as speaker 260. Although monitor 250 is shown as a separate device from information handling system 205, monitor 250 can be attached or included in information handling system 205. Monitor 250 may be also be configured to store one or more hardware equalizer settings or simply referred to herein as equalizer settings. For example, equalizer settings 270 may be stored in a memory in monitor 250. In another embodiment, equalizer settings 270 may also be stored in a memory or a data repository at information handling system 205. Equalizer settings 270 can be set to a frequency response compensation based on a hardware equalizer device and set each equalizer frequency band with different bandwidth/frequency range in the form of band-pass, high-pass, or low-pass filter.

Speaker 260 may include any system, device, or apparatus configured to produce sound in response to the audio signal input. Here, speaker 260 may be operable to receive audio data 265 and produce sound accordingly. Audio data 265 may be transmitted to speaker 260 by application 225 through various inputs such as video graphics array (VGA), digital visual interface (DVI), high-definition multimedia interface (HDMI), or DisplayPort (DP). Equalizer 255 may be used for tone control of the sound of audio data 265 produced at speaker 260. For example, conference calls may be optimized for speech or vocal settings while music application may be optimized for bass and treble.

Equalizer 255 is a hardware equalizer that isolates certain frequencies and either boosts the frequencies, lowers the frequencies, or leaves the frequencies unchanged. Equalizer 255 may adjust the balance between the various frequency tunings and various types of high/low/band-pass filters based on hardware equalizer settings such as equalizer settings 270. Equalizer settings 270 may include pre-defined equalizer settings also referred to as preset equalizer settings. Preset equalizer settings include default preset equalizer settings and user-defined equalizer settings. The default preset equalizer settings may be associated with various applications such as media players, games, video conference applications, voice call applications, etc. The applications may be automatically identified by display controller 215. In addition, display controller 215 may associate an identified application with a corresponding equalizer setting. The user may view and/or update the associations via on-screen display menu 280. In addition, the user may set the equalizer settings for applications that were not automatically identified by display controller 215 via on-screen display menu 280.

Display controller 215 which includes an on-screen display control software may be configured to manage a monitor such as monitor 250 or a group of monitors. An example of display controller 215 includes Dell Display Manager. Display controller 215 may be configured to control commands for displaying, locating, and maintaining software application display windows rendered on a display screen such as display 275. Also, display controller 215 may be configured to allow a user to input data and/or instructions to information handling system 205 and/or otherwise manage the one or more monitors via on-screen display menu 280. The user may input data and/or instructions via a keypad, keyboard, touch screen, and/or other data input device. In addition, display controller 215 may be configured to allow users to configure their monitor settings such as brightness, contrast, and one or more preset modes such as an audio preset mode using an on-screen display menu such as on-screen display menu 280. In particular, display controller 215 may be configured to manage the equalizer settings of the audio content of various applications.

Display controller 215 may be configured to determine command inputs to the graphics processing unit and display device drivers to determine the application and/or the type of the application that is currently active such as application 225. In addition, display controller 215 may determine whether the application has audio and/or video content or not. For example, display controller 215 can determine that a word application typically does not have audio or video content compared to a video teleconference application such as Zoom®. Display controller 215 may keep a list of applications, wherein each one application has a default equalizer setting. If an application does not have a default equalizer setting, then a user can add the application via the on-screen display. In addition, the user can update the equalizer setting of the application.

Display controller 215 may be configured to automatically switch between equalizer settings based on a frame or image currently displayed on monitor 250. Display controller 215 may apply one equalizer setting when it detects an application is currently in operation and then switch to a different equalizer setting when it detects another application in operation providing a better user experience. For example, display controller 215 may apply surround sound equalizer setting when it detects a gaming application and then switch to apply a pure vocal equalizer setting when it detects that a conference call application such as Zoom or Skype® is now in operation instead. An application currently in operation may also be referred to herein as an active application. An on-screen message may momentarily display the current audio preset mode or hardware equalizer setting whenever the hardware equalizer setting changes. Display controller 215 may be configured to use various communication channels such as a display data channel/ command interface (DDC/CI) channel to communicate with monitor 250. The DDC/CI standard specifies a means for an information handling system to send commands to a monitor as well as receive sensor data from the monitor over a bidirectional link.

Figure 5:
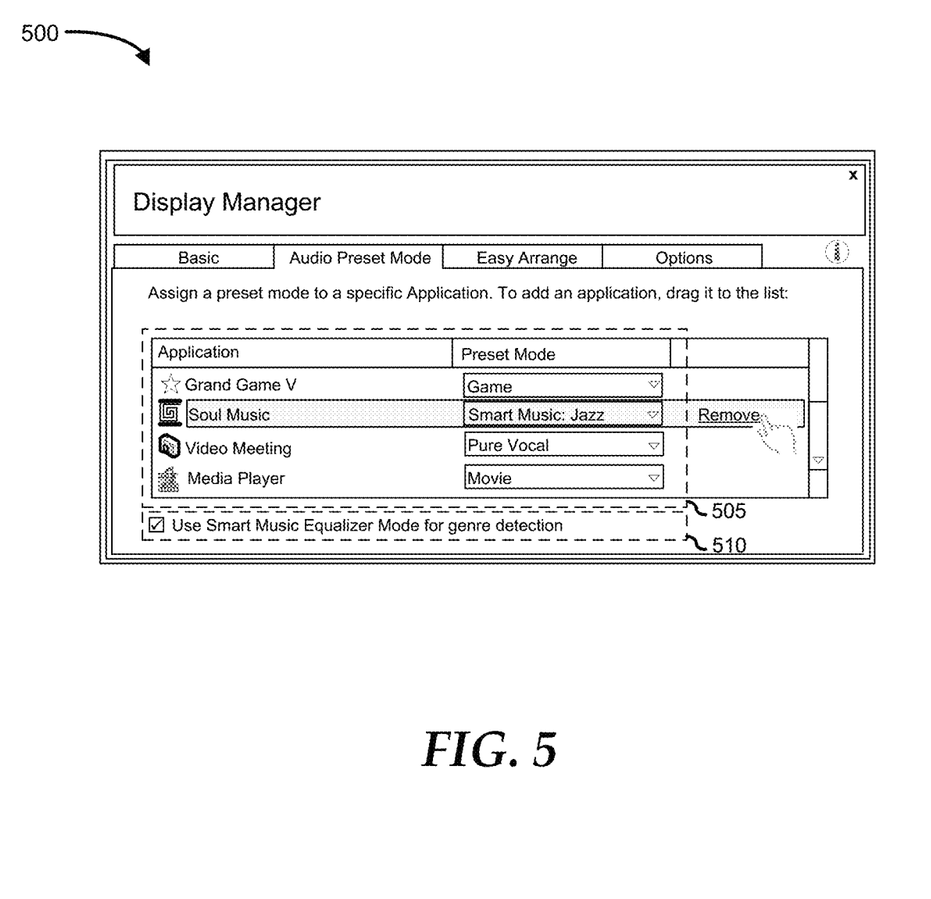
FIG. 5 is a diagram of a user interface for managing adaptive automated preset audio equalizer settings, according to an embodiment of the present disclosure.

Display controller 215 may include in audio control unit 217 which automatically switches hardware equalizer settings based on the active application. The equalizer setting associated with the active application may be automatically used if the application is detected on any one of the monitors connected to the information handling system. If a smart music equalizer mode genre detection or simply genre detection is enabled in on-screen display menu, then audio control unit 217 may be configured to apply equalizer settings associated with the genre of the music being played based on a sub-tier of a pre-defined equalizer setting associated with music. The genre of the music being played may be determined from its music file metadata which may be passed to display controller 215 and/or scaler 292. An example of on-screen display menu 280 is shown in FIG. 5.

Display controller 215 may include a decoder configured to extract metadata 235 of application 225. Display controller 215 may also extract meta-data from audio data 265 and image 285. Audio data 265 may be currently playing at speaker 260 while image 285 is displayed at display 275. Audio data 265 and image 285 may be associated with application 225. In another embodiment, audio data 265 and image 285 may be provided by a service at service provider 295.

Display 275 may include any suitable system, device, or apparatus configured to display human perceptible graphical data and/or alphanumeric data to a user. For example, in some embodiments, display 275 may be a liquid crystal display. Display 275 receives signals from interface board 290 which includes a scaler 292. The signals received by display 275 may be from application 225 or service provider 295 accessed via network 294. Network 294 may be accessed via network port 240.

Scaler 292 is a chipset that may be configured to analyze image 285 to determine what type of frame or image is displayed. Scaler 292 may be configured to perform a histogram analysis of the image or video content displayed and determine the frame rate of image 285. Image 285 may be a still or a moving frame or image such as a video graphic image. Scaler 292 may also be configured to detect the refresh rate of image 285. Lastly, scaler 292 may be configured to select one of the pre-defined hardware equalizer settings for image 285 based on the histogram analysis and frame rate in addition to the feedback from display controller 215.

Processor 210 may include any system, device, or apparatus configured to interpret and/or execute program instructions and/or process data, and may include, without limitation, a microprocessor, microcontroller, digital signal processor, application-specific integrated circuit, or any other digital or analog circuitry configured to interpret and/or execute program instructions and/or process data. In some embodiments, processor 210 may interpret and/or execute program instructions and/or process data stored in memory 220 and/or another component of information handling system 205. Processor 210 may be similar to processor 102 or processor 104 of FIG. 1.

Memory 220 may be communicatively coupled to processor 210 and may include any system, device, or apparatus configured to retain program instructions and/or data for a period of time such as a computer-readable media. Memory 220 may include a RAM, electrically erasable programmable read-only memory (EEPROM), personal computer memory card international association (PCMCIA) card, flash memory, magnetic storage, opto-magnetic storage, or any suitable selection and/or array of volatile or non-volatile memory that retains data after power to information handling system 205 is turned off.

Operating system 230 can provide information on the application type of the audio and/or video being rendered to a speaker or display respectively. In certain implementations, operating system 230 may be used in the implementation of adaptive hardware equalizer settings. Operating system 230 can utilize the audio preset mode in the on-screen display menu to allow for automatically switching between hardware equalizer settings. Furthermore, operating system 230 can be utilized for smart application scene detection in determining the active application and the corresponding hardware equalizer setting thus facilitating the switch.

Figure 3:
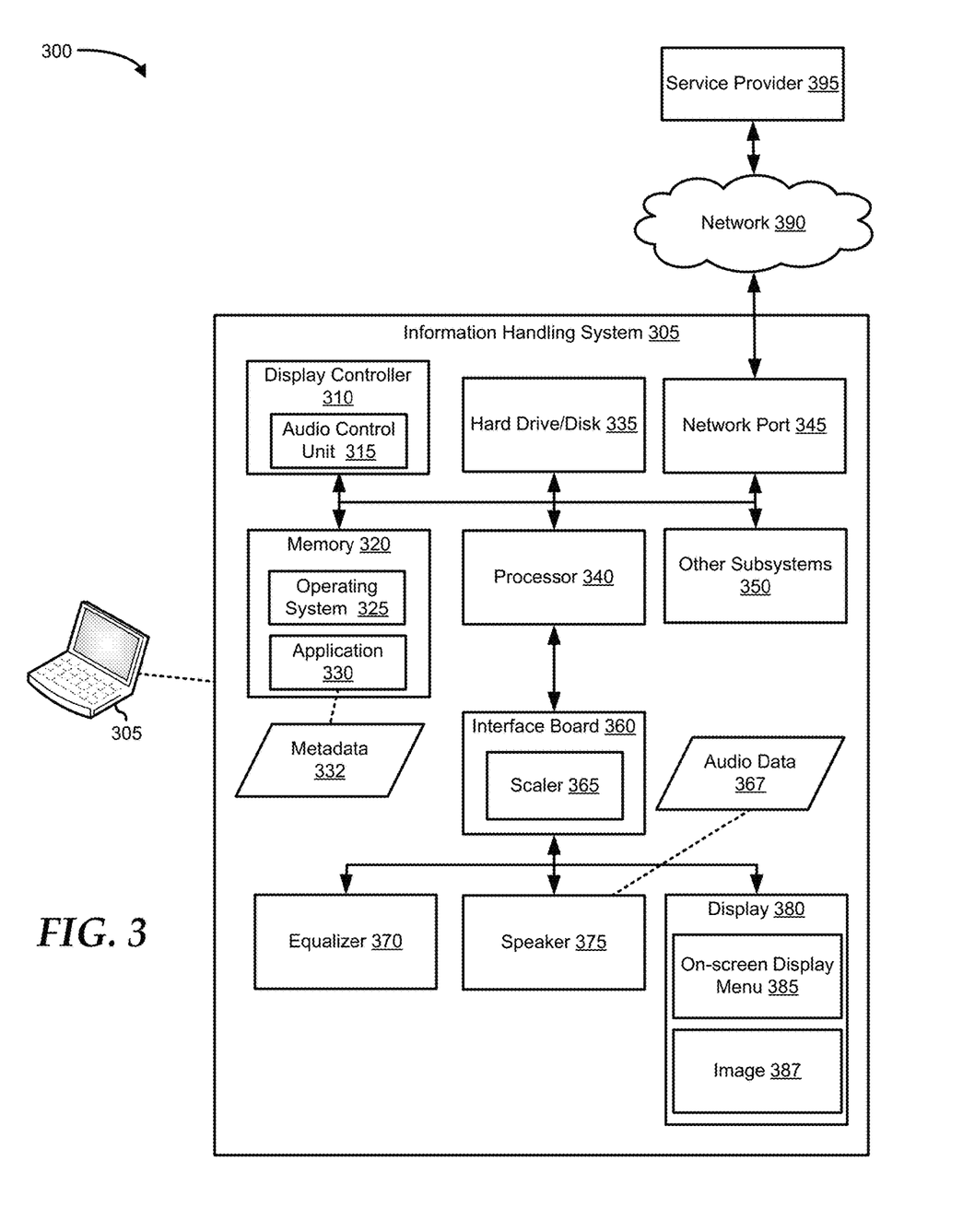
FIG. 3 is a block diagram illustrating an example of a system for adaptive automated preset audio equalizer settings, according to an embodiment of the present disclosure.

FIG. 3 shows a block diagram that depicts a system 300 where systems and methods for switching audio equalization adaptively can be implemented. System 300 includes an information handling system 305, a network 390, and a service provider 395. Information handling system 305 includes a display controller 310, a memory 320, a hard drive/disk 335, a processor 340, an interface board 360, a network port 345, other subsystems 350, an interface board 360, an equalizer 370, a speaker 375, and a display 380. Memory 320 includes an operating system 325 and an application 330. Interface board 360 includes a scaler 365. Display 380 includes an on-screen display menu 385. Network port 345 may be operable to connect to network 390 and service provider 395.

Information handling system 305 may be configured as a portable information handling system that is similar to information handling system 205 of FIG. 2 and includes a liquid crystal display (LCD) panel disposed of in a housing. Information handling system 305 may include a notebook, a laptop, an all-in-one computer, a netbook, a smartbook, a Chromebook, an Ultrabook, a smartphone, a persona digital assistant, or the like. Information handling system 305 may also include a music player, a video player, a multimedia player, or any device capable of playing audio and/or video data.

The functions and/or configurations of the various components of information handling system 305 may be similar to the functions and/or configurations of the components of information handling system 205 of FIG. 2. For example, display controller 310 is similar to display controller 215 of FIG. 2. Accordingly, audio control unit 315 is similar to audio control unit 217. Display controller 310 may be configured to automatically switch between hardware equalizer settings of equalizer 370 for audio data 367 when played by speaker 375. Display controller 310 may be configured to perform an application scene detection of an image displayed at display 380 of application 330, wherein display controller 310 may determine the application and/or application type of application 330 and switch to its corresponding equalizer setting based on the pre-defined equalizer settings at on-screen display menu 385. Display controller 310 may also be configured to extract metadata 332 associated with application 330 to determine application information such as application type.

Similarly, interface board 360 is similar to interface board 290 of FIG. 2. Accordingly, scaler 365 is similar to scaler 292 of FIG. 2. Scaler 365 may be configured to analyze the frame or image associated with application 330 that is displayed at a display device such as display 380. The analysis may include a histogram analysis and/or determination of the refresh or frame rate of the frame/image or video content displayed at display 380. The analysis may be performed on each frame of the video content. Based on the analysis a signature may be determined which may be used to identify the application type and/or application currently in operation. The application may be associated with audio content currently played at speaker 375 and/or frame/image currently displayed at display 380.

Figure 4:
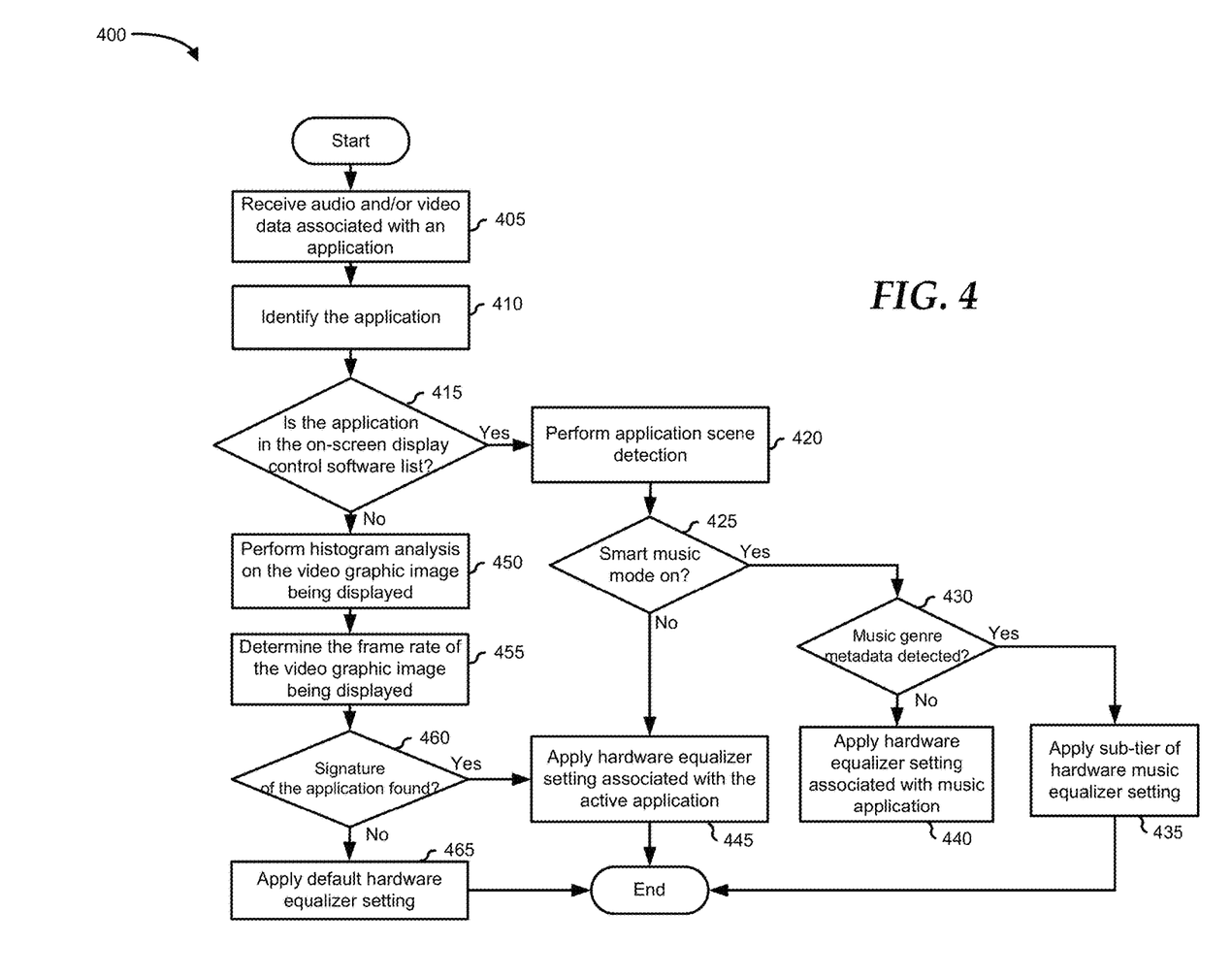
FIG. 4 is a flowchart illustrating an example of a method for adaptive automated preset audio equalizer settings, according to an embodiment of the present disclosure.

FIG. 4 shows a flowchart of a method 400 for implementing an adaptive hardware audio equalization based on the detected user application scene. Method 400 provides a desirable user experience by switching audio hardware equalizer settings adaptively instead of the user manually setting the equalizer settings. Method 400 may be performed by a display controller and a scaler similar to display controller 215 and scaler 292 respectively of FIG. 2. Method 400 may also be performed by display controller 310 and scaler 365 of FIG. 3. In particular, block 450, block 455, decision block 460, and block 465 may be performed by the scaler whereas the other blocks may be performed by the display controller. While embodiments of the present disclosure are described in terms of system 200 of FIG. 2 and system 300 of FIG. 3, it should be recognized that other systems may be utilized to perform the described method.

Method 400 typically starts at block 405 where the method receives or detects audio and/or data associated with an operation. The operation may be performed by an application similar to application 330 of FIG. 3 or application 225 of FIG. 2. The method proceeds to block 410 where the method may determine or identify the application in operation, such as by using metadata associated with the application. After determining or identifying the application in operation, the method proceeds to decision block 415, where it identifies whether the application is included in the list of applications with corresponding hardware equalizer settings. The list may also be referred to as an application assignment list or the on-screen display control software list. If the application is included in the application assignment list, then the "YES" branch is taken and the method proceeds to block 420. If the application is not included in the application assignment list, then the "NO" branch is taken and the method proceeds to block 450.

At block 420, the method performs application scene detection, wherein the method detects a frame or an image displayed that is associated with the application. The method may detect the application scene based on the application metadata. In addition, the method may detect whether the frame or the image includes audio and/or video data such as a music application, a video application, a teleconference application, etc. The method may also determine whether the application does not include audio and/or video data such as a word processor application, spreadsheet application, electronic mail application, etc. The method proceeds to decision block 425.

At decision block 415, the method determines if the smart music mode is enabled. The smart music mode allows the method to determine the genre of the audio data, in particular a musical audio data. If the smart music mode is enabled, then the "YES" branch is taken and the method proceeds to decision block 430. If the smart music mode is not enabled, then the "NO" branch is taken and the method proceeds to block 445.

At decision block 430, the method determines if a music genre metadata is detected that is associated with the audio data of the active application. If the music genre metadata is detected, then the "YES" branch is taken and the method proceeds to block 435. If the music genre metadata is not detected, then the "NO" branch is taken and the method proceeds to block 440.

At block 435, the method applies the equalizer setting corresponding to the music genre. For example, as shown in FIG. 5, if the metadata associated with audio data is set to the jazz genre, then an equalizer setting corresponding to the jazz genre is applied. Other genres include pop, rock, hip-hop, classical, etc. At block 440, the method applies an equalizer setting corresponding to a default music application. The equalizer setting applied is not specific to a particular music genre. At block 445, the method applies a hardware equalizer setting corresponding to the active application. For example, if the active application is a video conference, the method may apply hardware equalizer settings for vocals.

At block 450, the method performs a histogram analysis of the frame or the image displayed. When performing the histogram analysis, the method may divide the display into zones and performs the histogram analysis for each of the pixels in each zone. Typically, the display may be divided into 1296 zones. The method may determine the intensity values of the pixels in each zone. The method may also perform a histogram analysis of color images which measures the brightness and darkness of the frame or the image and the colors across a range of 256 levels of tonality.

The histogram analysis may be used to determine the type of the frame or the image displayed which may be used to determine the associated application or application type such as music, movie, voice, games, etc. For example, using the histogram analysis, the method may determine whether the frame or the image displayed is a movie, such as in FIG. 6 or not, such as in FIG. 7. In another example, the method may determine whether the application is a game application by determining whether the frame or image includes a crosshair. The method may also identify the location of a taskbar if any, which indicates that the application may be an office application, such as a spreadsheet, a word document, a database, etc., like in FIG. 8. In yet another example, the method may determine an absence of taskbar and letterbox format, such as in video graphic images of a television production application. The television production application may further be classified as drama, sports, action, etc. Accordingly, different hardware equalizer settings may be associated with a particular classification.

At block 455, the method determines the frame rate of the frame or the image displayed. Frame rate is the speed at which images are shown and usually expressed as frames per second (FPS). Different types of applications are generally shown in different frame rates. For example, movies are usually displayed at 24 fps while television shows are generally displayed at 30 fps. Video games on the other hand are generally shown at 60 fps. The method may also determine the variable refresh rate of the frame or image displayed.

At decision block 460, the method determines if there is a signature found. An audio or video signature is a fingerprint of the audio content and/or video content accordingly. If there is a signature found, then the "YES" branch is taken and the method proceeds to block 445. If there is no signature found, then the "NO" branch is taken and the method proceeds to block 465 where the method applies a standard or default flat hardware equalizer setting. The method ends after block 465, block 445, or block 435.

FIG. 5 shows an example user interface such as an on-screen display 500 for multiple audio preset modes. In certain implementations, the on-screen display 500 can be presented as part of a settings program or on-screen display control software. On-screen display 500 can identify and manage various applications such as software programs, games, and multimedia presentations such as movies, videos, etc.

On-screen display 500 shows several applications that each has been associated with an equalizer setting. The applications may be included in an application assignment list, such as shown in block 505. A user may add a new application that is not on the list by dragging the application such as its icon to block 505 at display 500. Display 500 allows a user to enable or disable an audio preset mode for one or more applications. Also, the audio preset mode allows a user to associate a preset equalizer setting with an application and apply the equalizer setting automatically when the application is in operation. For example, for a gaming application, a higher value for high-frequency sounds may be set while a voice call may have a different equalizer setting that is specific for vocals.

For a music application, display 500 allows the user to enable or disable a smart music equalizer mode for genre detection via block 510. The display controller automatically detects the genre of the music application and applies the corresponding equalizer setting if enabled. For example, if smart music equalizer mode for genre detection is enabled, then the display controller and/or scaler can automatically determine whether the music application belongs to a particular music genre such as popular music, jazz music, rock music, etc. In certain embodiments, the audio preset mode may be presented as inactive, such as unchecked and/or grayed out, when the smart music equalizer mode for genre detection is not enabled. If the check box associated with the smart musical equalizer mode in block 510 for genre detection is checked, a dropdown may appear in block 505 that allows the user to select a sub-tier music application hardware equalizer setting corresponding to the genre of the music application.

Figure 6:
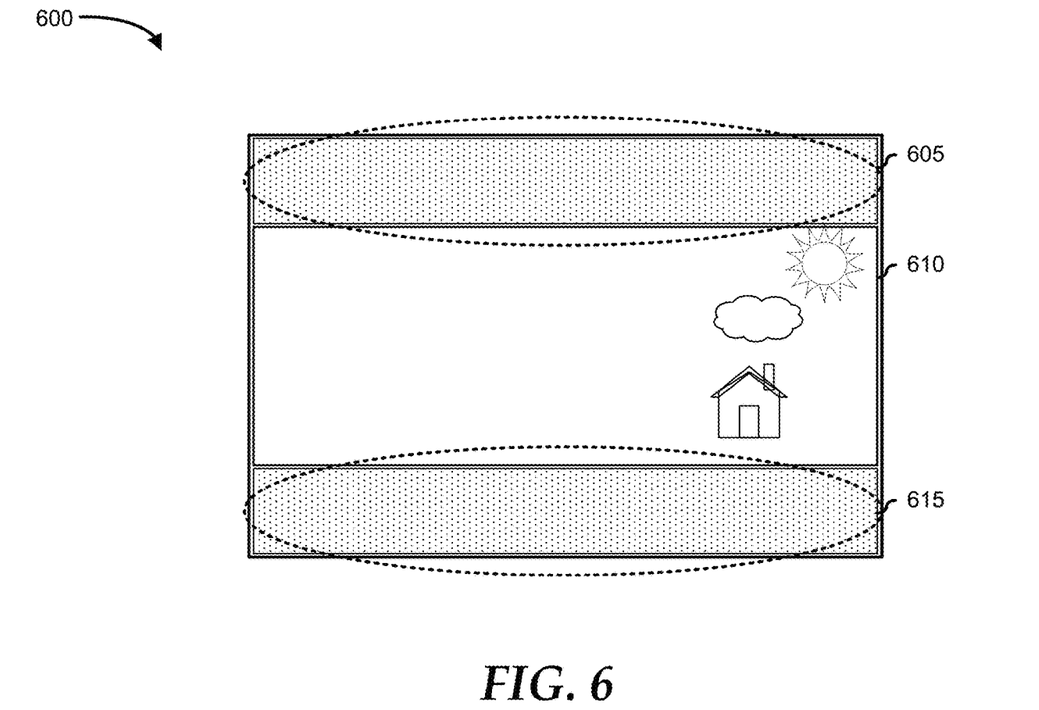
FIG. 6 is a diagram of a frame or an image displayed that is output from an application, according to an embodiment of the present disclosure.

FIG. 6 shows an example display window 600 which includes a frame or image 610.

Frame or image 610 may be a video graphic image. For example, frame or image 610 may be a frame of a movie in a letterbox format. Letterboxing is the practice of transferring film shot in a widescreen aspect ratio to standard-width video format while preserving the film's original aspect ratio. The resulting image has black bars above and below frame or image 610, such as a black bar 605 and a black bar 615. These black bars are part of each frame of the video signal. These black bars may be detected during histogram analysis by comparing the brightness and darkness of the pixels in various zones. The histogram analysis can determine the spread of dark or light of the pixels are in a particular zone in addition to the intensity. Also, the histogram analysis may provide the number of pixels affected in the spread. Although this example shows an example of a video graphic image in the letterbox format, other formats may be determined such as the video graphic image in a window box format. The scaler may determine the signature of frame or image 610. For example, the signature may be based on the histogram analysis and the frame rate of frame or image 610.

Figure 7:
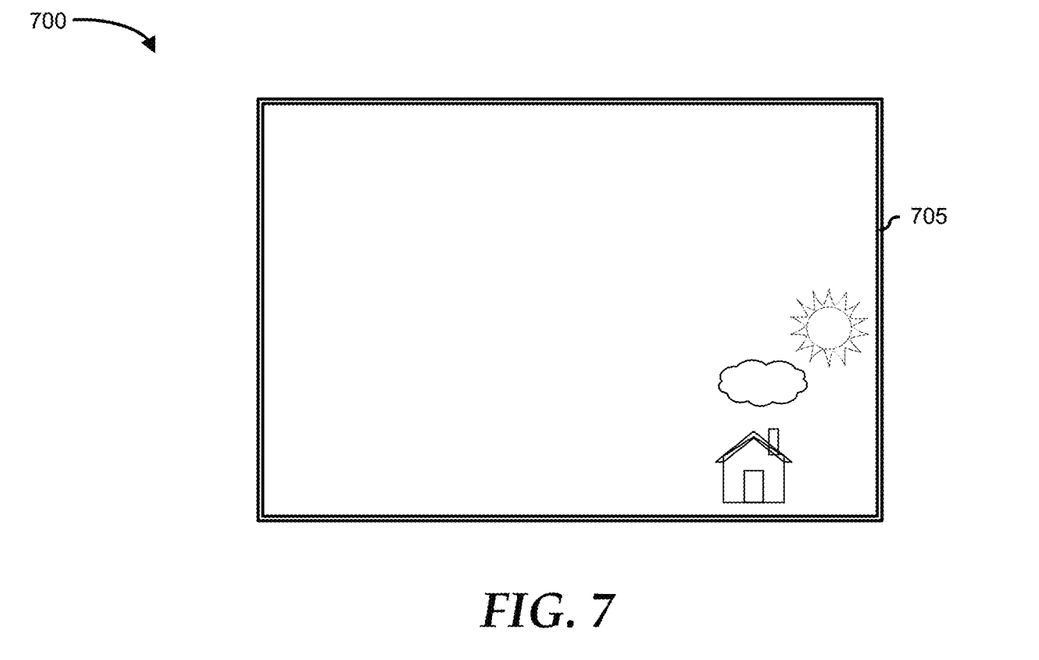
FIG. 7 is a diagram of a frame or an image displayed that is output from an application, according to an embodiment of the present disclosure.

FIG. 7 shows an example display window 700 which includes a frame or an image 705. Frame or image 705 may be a video graphic image. The scaler can perform the histogram analysis which can determine the spread of dark or light the pixels are in a particular zone in addition to its intensity. The scaler may also determine whether frame or image 705 is shown as a full screen without formatting. For example, the scaler may detect that frame or image 705 does not have a black bar above or below frame or image 705. The scaler can also determine the frame rate of frame or image 705. Similar to FIG. 6, the scaler can determine the signature of frame or image 705 based on the histogram analysis and the frame rate.

Figure 8:
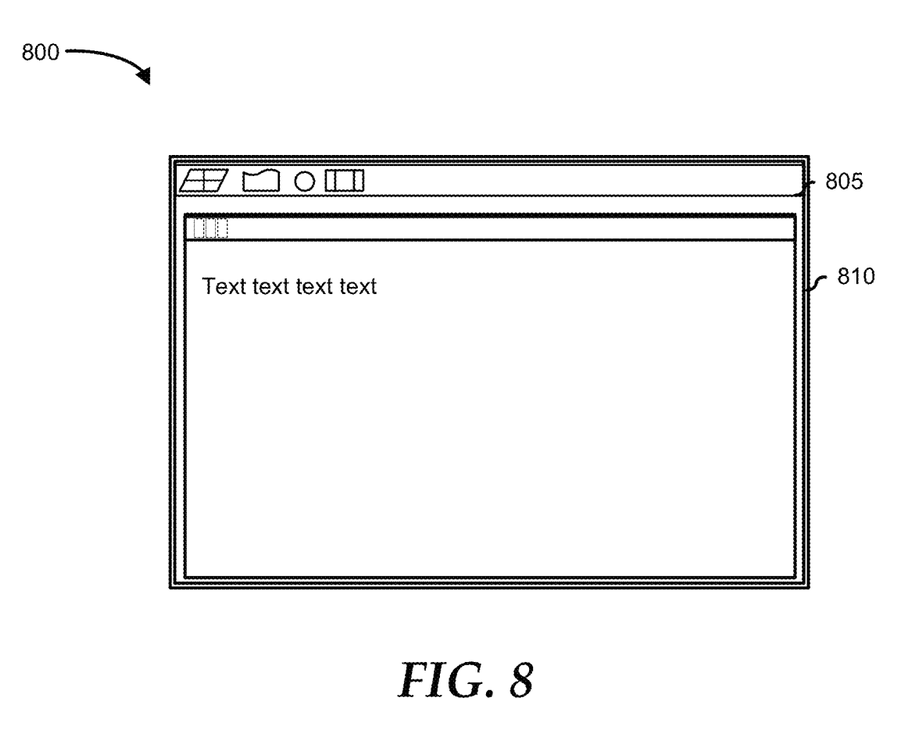
FIG. 8 is a diagram of a frame or an image displayed that is an output of an application, according to an embodiment of the present disclosure.

FIG. 8 shows an example display window 800 which includes a frame or an image 810. The scaler can perform the histogram analysis which can determine whether frame or image 810 includes a taskbar such as a taskbar 805. Although taskbar 805 is shown at the top of the display, taskbar 805 may be located on the bottom, left, or right side of frame or image 810. The scaler can also determine the refresh rate and/or signature of frame or image 810. Based on the aforementioned analysis, the scaler may determine that frame or image 810 is associated with an office application such as a photo editing software, a spreadsheet, a word processor, etc. In another example, the method may also determine whether the frame or the image displayed is associated with an application that does not need a hardware equalizer setting such as a Microsoft Office® application.

Although FIG. 4 shows example blocks of method 400 in some implementation, method 400 may include additional blocks, fewer blocks, different blocks, or differently arranged blocks than those depicted in FIG. 4. Additionally, or alternatively, two or more of the blocks of method 400 may be performed in parallel. For example, block 450 and block 455 may be performed in parallel.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionalities as described herein.

The present disclosure contemplates a computer-readable medium that includes instructions or receives and executes instructions responsive to a propagated signal; so that a device connected to a network can communicate voice, video, or data over the network. Further, the instructions may be transmitted or received over the network via the network interface device.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random-access memory or other volatile re-writable memory. Additionally, the computer-readable medium can include a magneto-optical or optical medium, such as a disk or tapes or another storage device to store information received via carrier wave signals such as a signal communicated over a transmission medium. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents but also equivalent structures.

What is claimed is:

1. A method comprising:
   detecting, by a processor, a frame or an image displayed by an application;
   identifying the application and determining whether the application is included in a pre-defined list of applications with corresponding hardware equalizer settings;
   in response to determining that the application is not included in the pre-defined list of applications, performing a histogram analysis of each pixel of the frame or the image displayed;
   determining a frame rate of the frame or the image displayed;
   determining a type of the application based on the histogram analysis and the frame rate; and
   in response to determining that the application includes audio content, applying a hardware equalizer setting for the audio content based on the application type, wherein the hardware equalizer setting is from the pre-defined list of applications with the corresponding hardware equalizer settings.

2. The method of claim 1, wherein the determining the application type is further based on metadata associated with the application or the frame or the image displayed.

3. The method of claim 1, further comprising determining a signature of the application based on the histogram analysis and the frame rate.

4. The method of claim 1, wherein performing the histogram analysis includes determining whether the frame or the image is in a letterbox format.

5. The method of claim 1, wherein performing the histogram analysis includes determining whether the frame or the image is not in a letterbox format.

6. The method of claim 1, further comprising determining a refresh rate of the frame or the image displayed.

7. The method of claim 1, wherein the corresponding hardware equalizer settings are stored in a monitor.

8. The method of claim 7, applying a sub-tier hardware equalizer setting based on a music application genre.

9. An information handling system, comprising:
   a processor configured to detect a frame or an image displayed at a display device by an application;
   an interface board coupled to the display device; and
   a scaler chip that resides in the interface board and configured to:
      determine a frame rate of the frame or the image;
      identify the application and determine whether the application is included in a pre-defined list of applications with corresponding hardware equalizer settings;
      in response to a determination that the application is not included in the pre-defined list of applications, determine a type of the application based on a histogram analysis of each pixel of the frame or the histogram analysis and on the frame rate; and
      in response to a determination that the application includes audio content, apply a hardware equalizer setting for the audio content based on the application type, wherein the hardware equalizer setting is from the pre-defined list of applications with the corresponding hardware equalizer settings.

10. The information handling system of claim 9, wherein the determination of the application type is further based on metadata associated with the application.

11. The information handling system of claim 9, further comprising determining a signature of the application based on the histogram analysis and the frame rate.

12. The information handling system of claim 9, wherein performing the histogram analysis includes determining whether the frame or the image is in a letterbox format.

13. The information handling system of claim 9, further comprising determining a refresh rate of the frame or the image.

14. The information handling system of claim 9, wherein the corresponding hardware equalizer settings are stored in the display device.

15. A non-transitory computer-readable medium including code that when executed performs a method, the method comprising:
   detecting a frame or an image displayed by an application;
   identifying the application and determining whether the application is included in a pre-defined list of applications with corresponding hardware equalizer settings;
   in response to determining that the application is not included in the pre-defined list of applications, performing a histogram analysis of each pixel of the frame or the image;
   determining a frame rate of the frame or the image;
   determining an application type of the application based on the histogram analysis and the frame rate; and
   in response to determining that the application includes audio content, applying a hardware equalizer setting for the audio content based on the application type, wherein the hardware equalizer setting is from the pre-defined list of applications with the corresponding hardware equalizer settings.

16. The non-transitory computer-readable medium of claim 15, wherein the determining the application type is further based on metadata associated with the application.

17. The non-transitory computer-readable medium of claim 15, further comprising determining a signature of the application based on the histogram analysis and the frame rate.

18. The non-transitory computer-readable medium of claim 15, wherein performing the histogram analysis includes determining whether the frame or the image is in a letterbox format.

19. The non-transitory computer-readable medium of claim 15, wherein the corresponding hardware equalizer settings are stored in a monitor.

20. The non-transitory computer-readable medium of claim 15, applying a sub-tier hardware equalizer setting based on a music application genre.

* * * * *